(12) United States Patent
Zhang et al.

(10) Patent No.: US 12,245,483 B2
(45) Date of Patent: *Mar. 4, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Jia Zhang, Hubei (CN); Feifei Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/519,831

(22) Filed: Nov. 27, 2023

(65) Prior Publication Data
US 2024/0107838 A1 Mar. 28, 2024

Related U.S. Application Data

(63) Continuation of application No. 17/275,442, filed as application No. PCT/CN2020/130056 on Nov. 19, 2020, now Pat. No. 11,864,397.

(30) Foreign Application Priority Data

Nov. 9, 2020 (CN) .......................... 202011239396.7

(51) Int. Cl.
*H10K 59/131* (2023.01)
*H10K 59/124* (2023.01)

(52) U.S. Cl.
CPC ......... *H10K 59/131* (2023.02); *H10K 59/124* (2023.02)

(58) Field of Classification Search
CPC .......................... H10K 59/131; H10K 59/124
(Continued)

(56) References Cited

U.S. PATENT DOCUMENTS 11,864,397 B2 * 1/2024 Zhang .................. H10K 59/131

FOREIGN PATENT DOCUMENTS

| CN | 110070801 A | 7/2019 |
|---|---|---|
| CN | 110491918 A | 11/2019 |

(Continued)

OTHER PUBLICATIONS

International Search Report in International application No. PCT/CN2020/130056, mailed on May 27, 2021.
(Continued)

*Primary Examiner* — Igwe U Anya (57) ABSTRACT

A display panel and a display device are provided. The display panel includes a main display area, and display area(s) surrounded by the main display area. The display panel includes first light-emitting devices disposed in the display area(s); first pixel driving circuits disposed in the display area(s), and electrically connected to the first light-emitting devices respectively for driving the first light-emitting devices to emit light; a first wiring layer connected between first pixel driving circuits and first light-emitting devices; a signal wiring layer electrically connected to the first pixel driving circuits and partially overlapping the first wiring layer; and a capacitive barrier layer disposed between the first wiring layer and the signal wiring layer and including at least one organic insulating layer.

20 Claims, 6 Drawing Sheets

(58) Field of Classification Search
USPC .......................................................... 257/40
See application file for complete search history.

(56) References Cited

FOREIGN PATENT DOCUMENTS

| | | | | |
|---|---|---|---|---|
| CN | 111312796 A | 6/2020 | | |
| CN | 111477672 A | 7/2020 | | |
| CN | 111833720 A | 10/2020 | | |
| CN | 111834418 A | 10/2020 | | |
| CN | 213692057 U | 7/2021 | | |
| CN | 110874990 B | * 3/2022 | ............. | G09F 9/302 |
| KR | 20170079978 A | 7/2017 | | |
| WO | 2020191870 A1 | 10/2020 | | |

OTHER PUBLICATIONS

Written Opinion of the International Search Authority in International application No. PCT/CN2020/130056, mailed on May 27, 2021.
Chinese Office Action issued in corresponding Chinese Patent Application No. 202011239396.7 dated Jul. 11, 2024, pp. 1-9.

* cited by examiner

DISPLAY PANEL AND DISPLAY DEVICE

CROSS-REFERENCE TO RELATED APPLICATIONS

The present application is a continuation application of U.S. application Ser. No. 17/275,442, filed on Mar. 11, 2021, which is a US national phase application based upon an International Application No. PCT/CN2020/130056, filed on Nov. 19, 2020, which claims priority to Chinese Patent Application No. 202011239396.7, submitted with the Chinese Patent Office on Nov. 9, 2020. The entire disclosures of the above applications are incorporated herein by reference.

BACKGROUND OF INVENTION

Field of Invention

The present application relates to the field of display technology, and in particular to a display panel and a display device.

Description of Prior Art

In the camera-under-panel (CUP) technology, in order to improve the light transmittance of light in a CUP area, the driving circuit for driving pixels in the CUP area can be arranged at a periphery of the CUP area, and a plurality of leads are used to electrically connect the driving circuit at the periphery of the CUP area to the pixels in the CUP area, but leads with a large number, densely arranged, and long cross-line distance are prone to generate parasitic capacitance, which causes uneven display in the CUP area and impacts the display quality of the display panel.

SUMMARY OF INVENTION

Embodiments of the present application provide a display panel and a display device, which can improve the problem of uneven display caused by parasitic capacitance in the display light transmission area.

An embodiment of the present application provides a display panel including a display light-transmitting area, a main display area, and a transition display area between the display light-transmitting area and the main display area, wherein the display panel includes:
  a first light-emitting device disposed in the display light-transmitting area;
  a first pixel driving circuit disposed in the transition display area, and electrically connected to the first light-emitting device for driving the first light-emitting device to emit light;
  a signal wiring layer electrically connected to the first pixel driving circuit;
  a first wiring layer extending along a direction from the transition display area to the display light-transmitting area, and connected between the first pixel driving circuit and the first light-emitting device, wherein the first wiring layer partially overlaps the signal wiring layer; and
  a capacitive barrier layer disposed between the first wiring layer and the signal wiring layer, wherein the capacitive barrier layer includes at least one organic insulating layer.

In some embodiments, a relative dielectric constant of the organic insulating layer is less than or equal to 3.8.

In some embodiments, the relative dielectric constant of the organic insulating layer is less than or equal to 3.3.

In some embodiments, a thickness of the organic insulating layer is greater than or equal to 0.5 microns and less than or equal to 3 microns.

In some embodiments, the thickness of the organic insulating layer is greater than or equal to 1.5 microns and less than or equal to 2.5 microns.

In some embodiments, a visible light transmittance of the organic insulating layer is greater than or equal to 85%.

In some embodiments, the organic insulating layer includes a photosensitive resin composition.

In some embodiments, the photosensitive resin composition includes a solvent, an additive, a photopolymerization initiator, and a polymer having a main component selected from at least one of a polyimide precursor structure, a polybenzoxazole precursor structure, a silicon-based precursor structure, a polyacrylic acid precursor structure, or a phenol resin structure.

In some embodiments, the capacitive barrier layer further includes an inorganic insulating layer on at least one side of the organic insulating layer.

In some embodiments, the inorganic insulating layer is disposed between the organic insulating layer and the signal wiring layer, and/or the inorganic insulating layer is disposed between the organic insulating layer and the first wiring layer.

In some embodiments, the organic insulating layer includes a first organic insulating layer and a second organic insulating layer, which are made of different materials.

In some embodiments, the first organic insulating layer and the second organic insulating layer have different dielectric constants and light transmittances.

In some embodiments, the signal wiring layer includes a power signal line connected to a first voltage terminal.

In some embodiments, the display panel further includes:
  a first insulating layer disposed between the first pixel driving circuit and the signal wiring layer, wherein the signal wiring layer is connected to the first pixel driving circuit through a via hole in the first insulating layer; and
  a planarization layer disposed between the first wiring layer and the first light-emitting device, wherein the first light-emitting device is connected to the first wiring layer through a via hole in the planarization layer.

In some embodiments, the first light-emitting device includes at least one of an organic light-emitting diode, a micro light-emitting diode, or a sub-millimeter light-emitting diode.

The present application also provides a display device including any of the above-mentioned display panels.

In some embodiments, the display device further includes a sensor faisng the display light-transmitting area.

Compared with the prior art, embodiments of the present application provide a display panel and a display device. The display panel includes a display light-transmitting area, a main display area, and a transition display area between the display light-transmitting area and the main display area, wherein the display panel includes: a first light-emitting device disposed in the display light-transmitting area; a first pixel driving circuit disposed in the transition display area, and electrically connected to the first light-emitting device for driving the first light-emitting device to emit light; a signal wiring layer electrically connected to the first pixel driving circuit; a first wiring layer extending along a direction from the transition display area to the display light-transmitting area, and connected between the first pixel driving circuit and the first light-emitting device, wherein the first wiring layer partially overlaps the signal wiring layer; and a capacitive barrier layer disposed between the first wiring layer and the signal wiring layer, wherein the capacitive barrier layer includes at least one organic insulating layer, such that the uneven display of the display light-transmitting area due to parasitic capacitance is improved, and the display effect of the display light-transmitting area is improved.

DETAILED DESCRIPTION OF PREFERRED EMBODIMENTS

In order to make the purpose, technical solution, and effect of the present application clearer and more definite, the present application is further described in detail below with reference to the accompanying drawings and examples. It should be understood that the specific embodiments described herein are only used to explain the present application, and are not used to limit the present application.

Figure 1A:
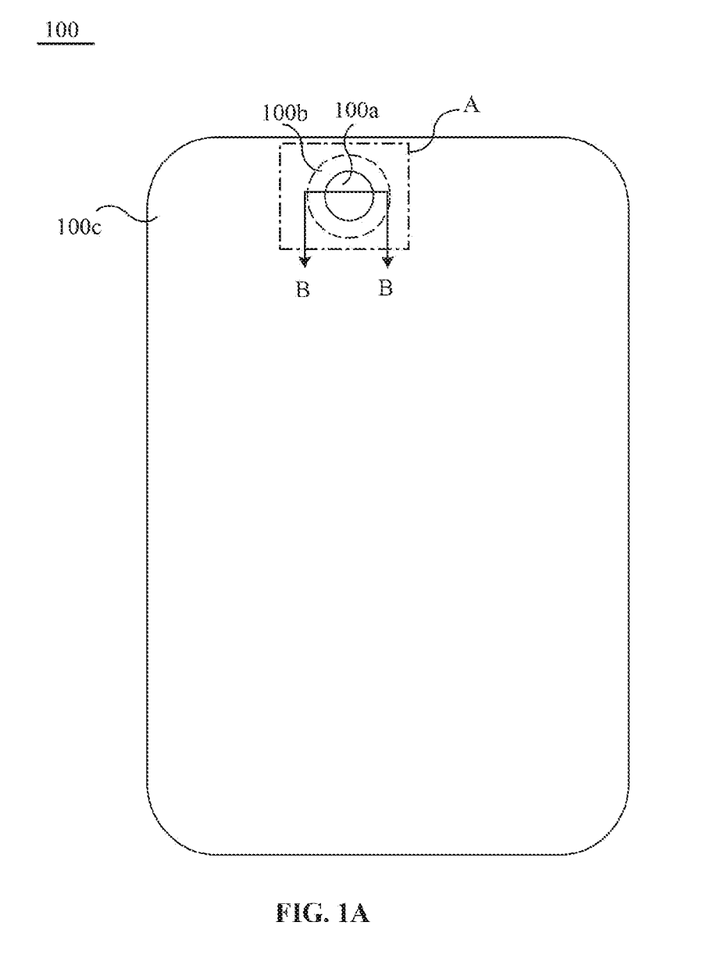
FIG. 1A is a schematic structural diagram of a display panel provided by an embodiment of the present application.
Figure 1B:
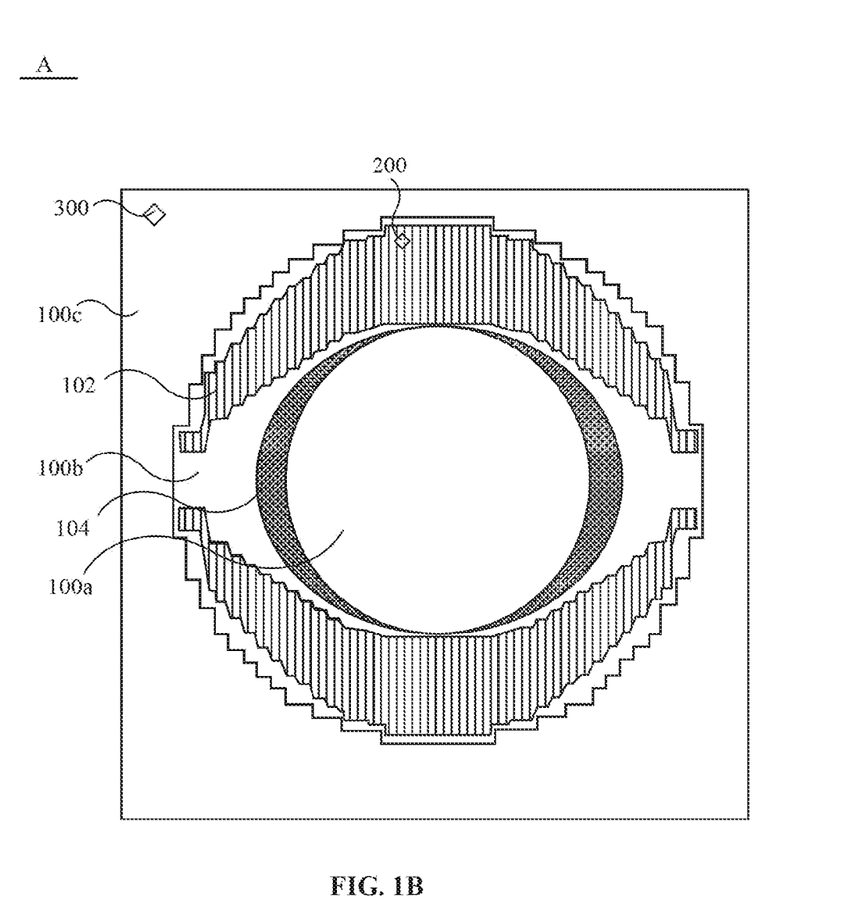
FIG. 1B is a partial enlarged view of the region A in FIG. 1A.
Figure 1C:
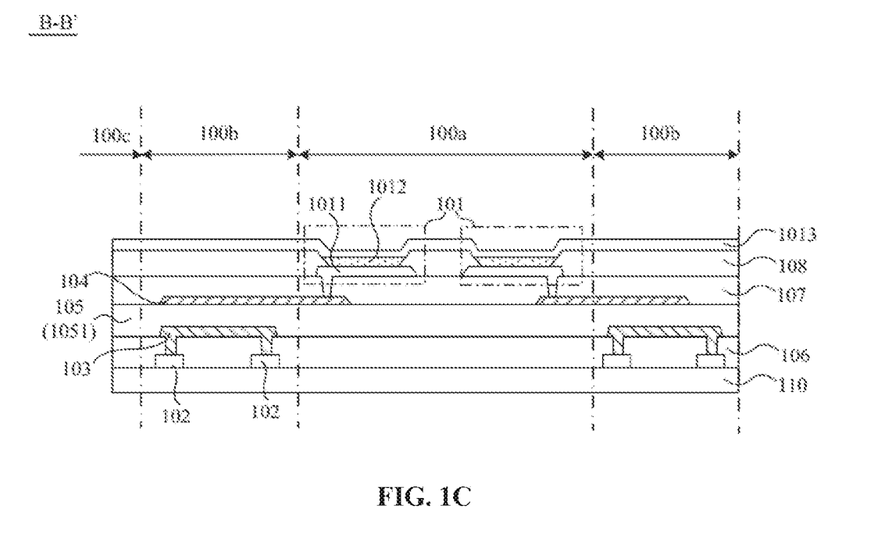
FIG. 1C to FIG. 1H are schematic structural sectional diagrams of the display panel along the line B-B' in FIG. 1A.
Figure 1D:
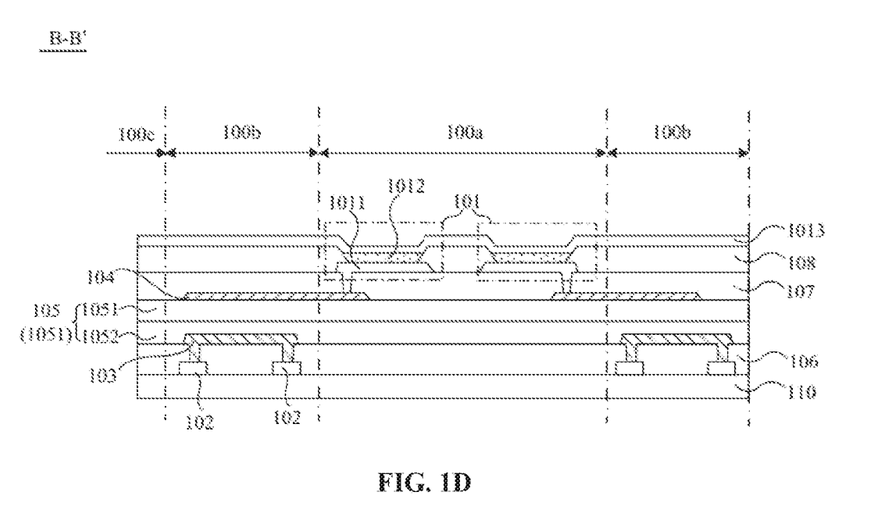
Figure 1E:
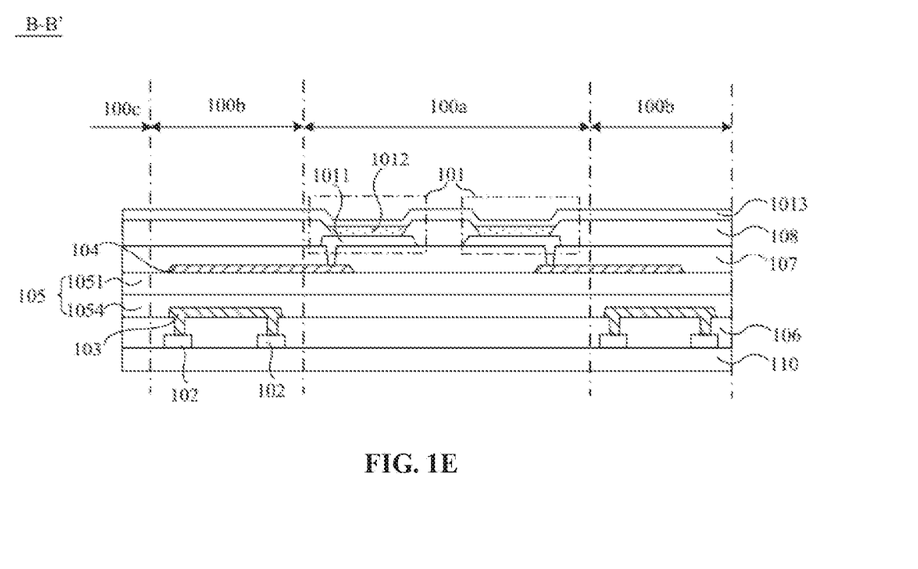
Figure 1F:
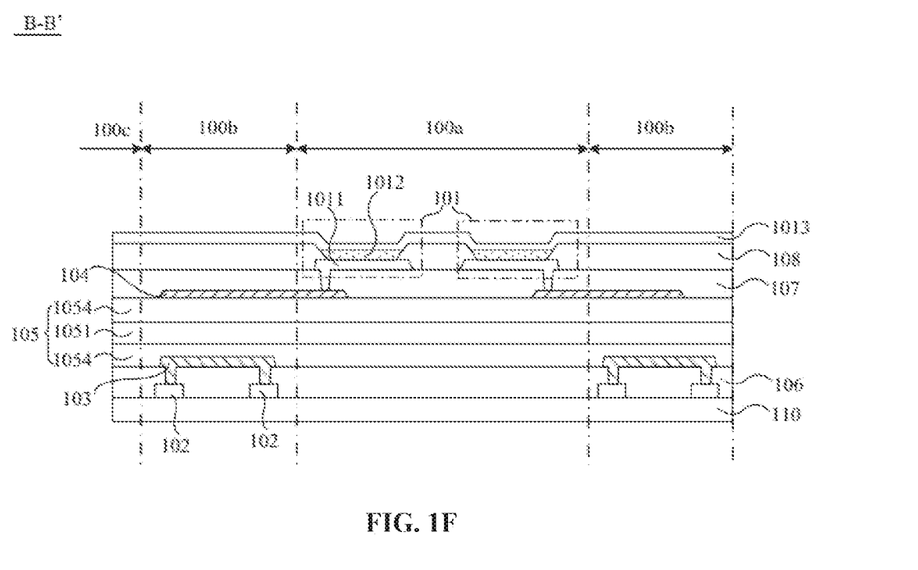
Figure 1G:
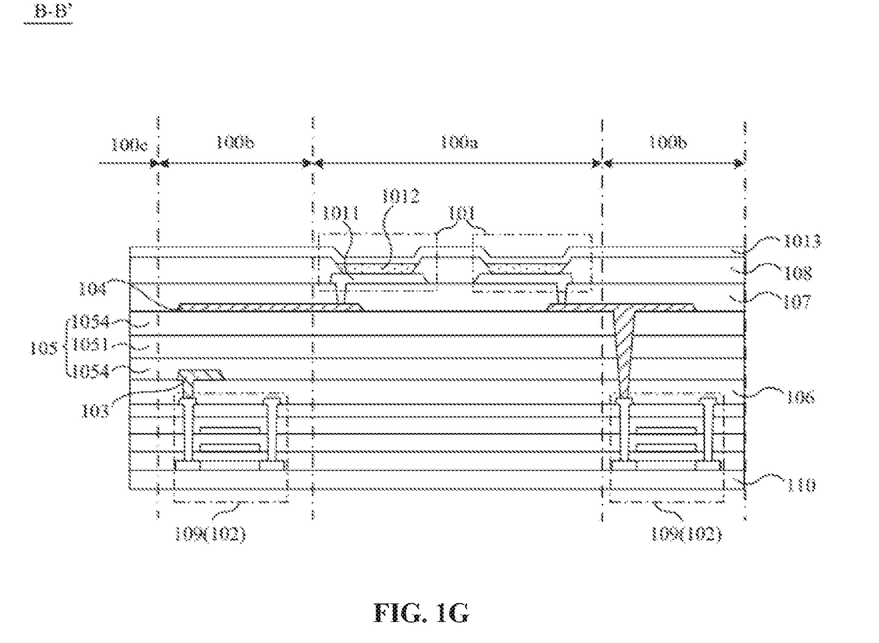
Figure 1H:
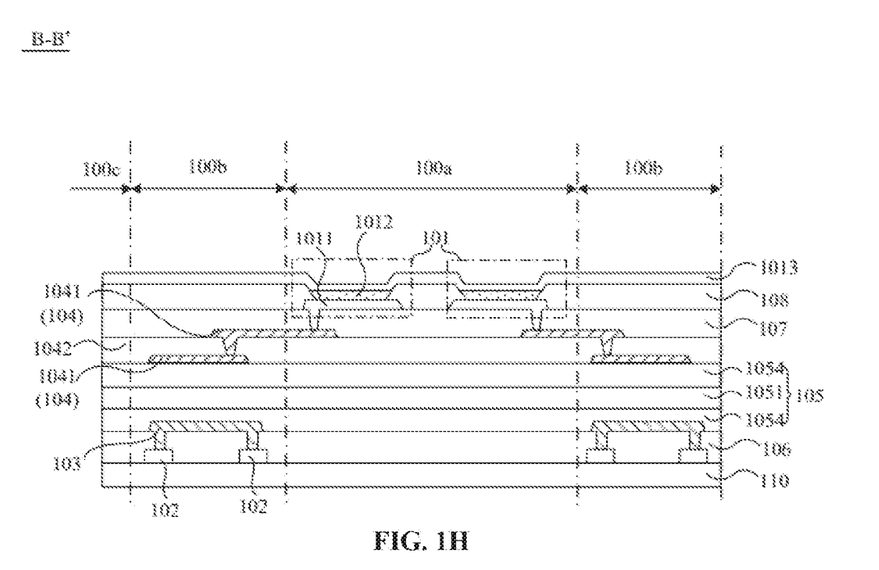
Figure 2:
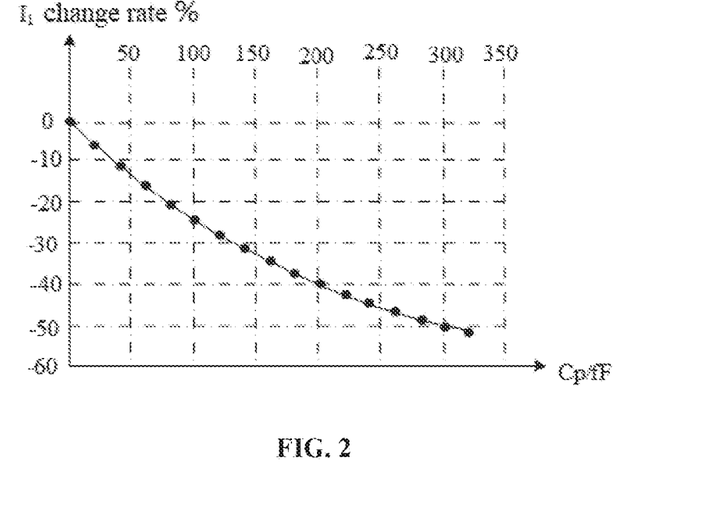
FIG. 2 is a diagram of a change relationship between a driving current change rate and a parasitic capacitance provided by an embodiment of the present application.

Specifically, referring to FIG. 1A, which is a schematic structural diagram of a display panel provided by an embodiment of the present application; as shown in FIG. 1B, which is a partial enlarged view of the region A in FIG. 1A; as shown in FIG. 1C to FIG. 1H, which are schematic structural sectional diagrams of the display panel along the line B-B' in FIG. 1A; and as shown in FIG. 2, which is a diagram of a change relationship between a driving current change rate and a parasitic capacitance provided by an embodiment of the present application.

An embodiment of the present application provides a display panel 100, including a display light-transmitting area 100$a$, a main display area 100$c$, and a transition display area 100$b$ between the display light-transmitting area 100$a$ and the main display area 100$c$. The display panel 100 includes:

a first light-emitting device 101 located in the display light-transmitting area 100$a$;

a first pixel driving circuit 102 located in the transition display area 100$b$, and electrically connected to the first light-emitting device 101 for driving the first light-emitting device 101 to emit light; and a signal wiring layer 103 located on a side of the first pixel driving circuit 102 close to the first light-emitting device 101, and electrically connected to the first pixel driving circuit 102.

Still referring to FIG. 1A to FIG. 1F, since the first wiring layer 104 is located on a side of the signal wiring layer 103 away from the first pixel driving circuit 102, extends along a direction from the transition display area 100 to the display light-transmitting area 100$a$, and is connected between the first pixel driving circuit 102 and the first light-emitting device 101, wherein the first wiring layer 104 partially overlaps the signal wiring layer 103.

A capacitive barrier layer 105 is located between the first wiring layer 104 and the signal wiring layer 103. The capacitive barrier layer 105 includes at least one organic insulating layer 1051 to reduce parasitic capacitance Cp generated between the first wiring layer 104 and the signal wiring layer 103, thereby reducing the influence of the parasitic capacitance Cp on the driving current I1 for driving the first light-emitting device 101 to emit light, and achieving a uniform display of the display light-transmitting area 100$a$.

The parasitic capacitance Cp generated by the wiring layer 104 and the signal wiring layer 103 complies with the equation: $Cp=S\varepsilon/4\pi kd$; where S is an overlapping area of the first wiring layer 104 and the signal wiring layer 103, and c is a relative dielectric constant of the capacitive barrier layer 105, d is a thickness of the capacitive barrier layer 105, and k is an electrostatic force constant. Therefore, the parasitic capacitance Cp generated by the first wiring layer 104 and the signal wiring layer 103 is affected by the overlapping area S of the first wiring layer 104 and the signal wiring layer 103, and the thickness d and the relative dielectric constant c of the dielectric layer (that is, the capacitive barrier layer 105) between the wiring layer 104 and the signal wiring layer 103, such that the parasitic capacitance Cp generated by the first wiring layer 104 and the signal wiring layer 103 can be reduced by adjusting the overlapping area S of the first wiring layer 104 and the signal wiring layer 103, and/or the thickness d and the relative dielectric constant c of the capacitive barrier layer 105.

That is, when the parameters of the capacitive barrier layer 105 are constant, the smaller the overlapping area S of the first wiring layer 104 and the signal wiring layer 103 is, the smaller the parasitic capacitance Cp generated between the first wiring layer 104 and the signal wiring layer 103 is. However, the overlapping area S of the first wiring layer 104 and the signal wiring layer 103 is affected by factors such as high resolution requirements of the display panel and a wiring process, and the first wiring layer 104 and the signal wiring layer 103 will inevitably have overlapping areas S of different sizes. Therefore, the parameters of the capacitor barrier layer 105 can be adjusted to further reduce the parasitic capacitance Cp generated between the first wiring layer 104 and the signal wiring layer 103.

Specifically, by reducing the relative dielectric constant c of the capacitive barrier layer 105, and/or increasing the thickness d of the capacitive barrier layer 105, the parasitic capacitance Cp generated between the first wiring layer 104 and the signal wiring layer 103 is reduced.

Further, the parasitic capacitance Cp generated between the first wiring layer 104 and the signal wiring layer 103 can be reduced by reducing the relative dielectric constant of the organic insulating layer 1051. For example, under a test condition at a frequency of 100 kHz, the relative dielectric constant of the organic insulating layer 1051 may be less than or equal to 3.8. Furthermore, the relative dielectric constant of the organic insulating layer 1051 is less than or equal to 3.3, so as to better reduce the parasitic capacitance Cp generated between the first wiring layer 104 and the signal wiring layer 103.

The organic insulating layer 1051 includes a weakly polar material or a non-polar material; and the organic insulating layer 1051 includes a photosensitive resin composition. The photosensitive resin composition includes a solvent, an additive, a photopolymerization initiator, and a polymer having a main component selected from at least one of a polyimide precursor structure, a polybenzoxazole precursor structure, a silicon-based precursor structure, a polyacrylic acid precursor structure, or a phenol resin structure. The organic insulating layer 1051 can reduce the relative dielectric constant of the organic insulating layer 1051 by selecting a low-polar polymer as its main chain structure, and grafting a large-volume, low-polar side chains on the main chain.

Specifically, by increasing the thickness of the organic insulating layer 1051, the parasitic capacitance Cp generated between the first wiring layer 104 and the signal wiring layer 103 is reduced; wherein the organic insulating layer 1051 has a thickness greater than or equal to 0.5 microns and less than or equal to 3 microns. As described, the thickness of the organic insulating layer 1051 can be equal to 0.5 microns, 0.55 microns, 0.7 microns, 0.85 microns, 1.2 microns, 1.4 microns, 1.8 microns, 2.2 microns, 2.5 microns, 2.8 microns, 2.9 microns, 2.98 microns, 3 microns, etc.

Further, in order to ensure the light transmittance of the display light-transmitting area 100a, the thickness of the first wiring layer 104 is generally thin, and the capacitor barrier layer 105 is located under the first wiring layer 104. If the thickness of the capacitor barrier layer 105 is thin, a step difference is likely to be present on the capacitor barrier layer 105, which can easily cause problems such as cracks and disconnections in the first wiring layer 104, thus impacting normal display of the display light transmission area 100a. Therefore, making the organic insulating layer 1051 have a certain thickness can eliminate the step difference on the capacitor barrier layer 105 and prevent the first wiring layer 104 from problems such as cracking, disconnection, and so on. However, an excessive thickness of the organic insulating layer 1051 will increase difficulty of matching a film stress of the display panel 100 in the manufacturing process, and cause problems such as warpage or fragmentation of the display panel 100. Therefore, on the one hand, in order to make the first organic insulating layer 1051 play a role of film planarization, reduce the difficulty of film stress matching, and prevent the display panel 100 from warping or chipping, and on the other hand, in order to reduce the parasitic capacitance Cp generated between the first wiring layer 104 and the signal wiring layer 103, the thickness of the organic insulating layer 1051 may be greater than or equal to 1.5 microns and less than or equal to 2.5 microns. For example, the thickness of the organic insulating layer 1051 may be equal to 1.5 microns, 1.55 microns, 1.7 microns, 1.85 microns, 1.9 microns, 1.94 microns, 2 microns, 2.2 microns, 2.35 microns, 2.4 microns, 2.5 microns, etc.

In addition, in order to prevent the organic insulating layer 1051 from impacting the light transmittance of the display light-transmitting area 100a, a visible light transmittance of the organic insulating layer 1051 can be greater than or equal to 85%. For example, the visible light transmittance of the organic insulating layer 1051 may be equal to 85%, 88%, 90%, 93%, 95%, 98%, 99%, etc.

Still referring to FIG. 1D, in order to reduce the parasitic capacitance Cp generated between the first wiring layer 104 and the signal wiring layer 103, while ensuring that the display light-transmitting area 100a still has good light transmission and maintaining the balance of various performance of the display light-transmitting area 100a, the organic insulating layer 1051 can be designed with a multilayered structure.

Specifically, the organic insulating layer 1051 includes a first organic insulating layer 1052 and a second organic insulating layer 1053, which are made of different material, to reduce the parasitic capacitance Cp generated between the first wiring layer 104 and the signal wiring layer 103, while improving the performance such as the light transmittance of the display light-transmitting area 100a or the interface adhesion of the organic insulating layer 1051.

Further, the first organic insulating layer 1052 and the second organic insulating layer 1053 have different dielectric constants; and further, the first organic insulating layer 1052 and the second organic insulating layer 1053 have different light transmittances. For example, when the dielectric constants of the first organic insulating layer 1052 and the second organic insulating layer 1053 are similar, if the light transmittance of the first organic insulating layer 1052 is better than that of the second organic insulating layer 1053, the thickness of the second organic insulating layer 1053 can be greater than the thickness of the first organic insulating layer 1052, so as to reduce the influence of the of the organic insulating layer 1051 on the light transmittance of the display light-transmitting area 100a, while reducing the parasitic capacitance Cp generated between the first wiring layer 104 and the signal wiring layer 103. Each of the first organic insulating layer 1052 and the second organic insulating layer 1053 includes a photosensitive resin composition.

It is understandable that the organic insulating layer 1051 may also include a third organic insulating layer, a fourth organic insulating layer, etc., to further adjust the light transmittance and other properties of the display light-transmitting area 100a, which will not be described in detail for brevity herein.

Still referring to FIG. 1E to FIG. 1H, the capacitive barrier layer 105 further includes an inorganic insulating layer 1054 on at least one side of the organic insulating layer 1051 to maintain the balance of various performance of the display light-transmitting area 100a.

Specifically, the inorganic insulating layer 1054 is located between the organic insulating layer 1051 and the signal wiring layer 103, and/or the inorganic insulating layers 1051.

It is understandable that the inorganic insulating layer 1054 can also be located between the two organic insulating layers 1051; and further, the organic insulating layer 1051 and the inorganic insulating layer 1054 can be periodically arranged between the first wiring layer 104 and the signal wiring layer 103, that is, the capacitive barrier layer 105 may include the organic insulating layers 1051 and the inorganic insulating layers 1054 alternately stacked on each other, and the organic insulating layers 1051 and the inorganic insulating layers 1054 stacked on each other may be periodically and repeatedly arranged between the first wiring layer 104 and the signal wiring layer 103.

Since the inorganic insulating layer 1054 has better water and oxygen barrier properties than the organic insulating layer 1051, disposing the inorganic insulating layer 1054 on at least one side of the organic insulating layer 1051 can block the gas or water vapor released by the organic insulating layer 1051 during the manufacturing process from impacting the first wiring layer 104 and the signal wiring layer 103. In addition, when the organic insulating layer 1051 is located under the inorganic insulating layer 1054, a bulging phenomenon present in some areas of the display panel 100 caused by the gas or water vapor released by the organic insulating layer 1051 during the manufacturing process can also be prevented, thus ensuring a better flatness of the display panel 100.

Still referring to FIG. 1A to FIG. 1H, the signal wiring layer 103 includes a power signal line connected to a first voltage terminal VDD. Further, as shown in FIG. 1G the first pixel driving circuit 102 includes a plurality of transistors 109, and the power signal line is electrically connected to one of a source or a drain of at least one of the transistors 109, and the first wiring layer 104 is electrically connected to one of a source or a drain of at least one of the transistors 109, so that the first light-emitting device 101 emits light under the driving of the first pixel driving circuit 102. The capacitance barrier layer 105 reduces the parasitic capacitance Cp generated between the first wiring layer 104 and the signal wiring layer 103, thereby reducing the influence of the parasitic capacitance Cp on a driving current I1 for driving the first light-emitting device 101 to emit light, thus improving the display uniformity of the display light-transmitting area 100a.

The plurality of transistors 109 include at least one of oxide transistors and silicon transistors. The plurality of transistors 109 include field effect transistors. Further, the plurality of transistors 109 include thin film transistors. It can be understood that the structure of the plurality of transistors 109 is not limited to a dual-gate structure shown in FIG. 1G, and those skilled in the art can also choose other structure forms, such as a single gate structure, etc., which will not be described in details herein for brevity.

Still referring to FIG. 2, when the parasitic capacitance Cp generated between the first wiring layer 104 and the signal wiring layer 103 is reduced from 300 fF to 50 fF, that is, the parasitic capacitance Cp is reduced by 6 times, a rate of change of the driving current I1 for driving the first light-emitting device 101 to emit light is reduced from 50.4% to 13.2%, and the influence of the parasitic capacitance Cp on the driving current I1 is significantly reduced, which is beneficial to achieve uniform display of the display light-transmitting area 100a.

Still referring to FIG. 1A to FIG. 1H, the display panel 100 further includes:
- a first insulating layer 106 located between the first pixel driving circuit 102 and the signal wiring layer 103, wherein the signal wiring layer 103 is connected to the first pixel driving circuit 102 through a via hole in the first insulating layer 106; and
- a planarization layer 107 disposed between the first wiring layer 104 and the first light-emitting device 101, wherein the first light-emitting device 101 is connected to the first wiring layer 104 through a via hole in the planarization layer 107.

Further, the first light-emitting device 101 includes:
- a first anode 1011 located on a side of the planarization layer 107 away from the first wiring layer 104. A material of the first anode 1011 includes a transparent conductive film. Further, the material of the first anode 1011 includes one of indium tin oxide, indium tin zinc oxide, etc., or a combination of indium tin oxide, indium tin zinc oxide, and silver.
- a first cathode 1013 located on a side of the first anode 1011 away from the planarization layer 107; and
- a first light-emitting layer 1012 located between the first anode 1011 and the first cathode 1013.

Further, the first light-emitting layer 1012 further includes one of a quantum dot material, a perovskite material, and a fluorescent material.
- a first light-emitting device 101 includes at least one of an organic light-emitting diode, a micro light-emitting diode, and a sub-millimeter light-emitting diode.
- ae first light-emitting device 101 includes a red light-emitting device, a blue light-emitting device, a green light-emitting device, a white light-emitting device, and/or the like.

Still referring to FIG. 1A to FIG. 1H, the display panel 100 further includes:
- a substrate 110, wherein the first pixel driving circuit 102 is located on the substrate 110, and the substrate 110 includes a rigid substrate and a flexible substrate, the substrate 110 is made of a material including glass, quartz, ceramic, plastic, polymer resin, and/or the like, and the polymer resin includes at least one of polyethersulfone, polyacrylate, polyarylate, polyetherimide, polyethylene naphthalate, polyethylene terephthalate, polyphenylene sulfide, polyallyl ester, polyimide, polycarbonate, cellulose triacetate, and/or cellulose acetate propionate.
- a pixel defining layer 108 located on the first anode 1011 and the planarization layer 107, wherein the first light-emitting layer 1012 is located in the pixel defining area of the pixel defining layer 108.

Further, the display panel 100 may also include other components not shown such as a touch electrode, a buffer layer, an encapsulation layer, a color film layer and so on.

Further, referring to FIG. 1H, the first wiring layer 104 includes a plurality of connecting wirings 1041 in different layers, an insulating layer 1042 is provided between the plurality of connecting wirings 1041, and the plurality of connecting wirings 1041 are electrically connected through via holes in the insulating layer 1042 to reduce a wiring density. The plurality of connecting wirings 1041 interconnected to each other extend from the transition display area 100b to the display light-transmitting area 100a to realize an electrical connection between the first pixel driving circuit 102 and the first light-emitting device 101. In FIG. 1B, only a portion of the first wiring layer 104 located in the transition display area 100 b is shown, and a portion of the first wiring layer 104 located in the display light-transmitting area 100 a is not shown.

Still referring to FIGS. 1A to 1B, the display panel 100 further includes:
- a second light-emitting device 200 located in the transition display area 100b, wherein the second light-emitting device 200 is driven to emit light by the first pixel driving circuit 102;
- a third light-emitting device 300 located in the main display area 100c; and
- a second pixel driving circuit located in the main display area 100c, which is configured to drive the third light-emitting device 300 to emit light.

Further, the light-emitting area of the third light-emitting device 300 is larger than the light-emitting area of the first light-emitting device 101; and further, the light-emitting area of the third light-emitting device 300 is larger than the light-emitting area of the second light-emitting device 200.

Further, the display panel 100 includes a first pixel unit located in the display light-transmitting area 100a, the first pixel unit includes a plurality of first pixels, each of the first pixels includes a plurality of sub-pixels, and the sub-pixels are formed by the first light-emitting device 101.

Further, the sub-pixels include first sub-pixels, second sub-pixels, and third sub-pixels with different light-emitting colors, and the first pixel includes two of the first sub-pixels, two of the second sub-pixels, and four of the third sub-pixels. The first sub-pixels, the second sub-pixels, and the third sub-pixels include red sub-pixels, green sub-pixels, blue sub-pixels, white sub-pixels, and so on. Specifically, the first sub-pixel is a red sub-pixel, the second sub-pixel is a blue sub-pixel, and the third sub-pixel is a green sub-pixel.

Further, the display panel 100 further includes:
- a second pixel unit located in the transition display area 100b, wherein the second pixel unit includes a plurality of second pixels, the second pixel includes a plurality of transition sub-pixels, the transition sub-pixels are formed by the second light-emitting device 200, and a number and arrangement of the transition sub-pixels included in the second pixel are the same as a number and arrangement of the sub-pixels included in the first pixel; and a third pixel unit located in the main display area 100c, wherein the third pixel unit includes a plurality of third pixels, the third pixel includes a plurality of main sub-pixels, the main sub-pixels are formed by the third light-emitting device 300, and a number and arrangement of the main sub-pixels included in the third pixel are the same as the number and arrangement of the sub-pixels included in the first pixel, so that the main display area 100c, the transition display area 100b, and the display light-transmitting area 100a have similar or identical display effects.

It is understandable that the display panel 100 may include a plurality of the display light-transmitting areas 100a, positions of the plurality of the display light-transmitting areas 100a can be set according to actual requirements, and details are not described herein for brevity.

The present application also provides a display device including any of the above-mentioned display panels.

Further, the display device further includes a sensor that faces the display light-transmitting area, so that the display device realizes functions such as fingerprint recognition, imaging, light sensing, and distance sensing.

Specifically, the sensor includes a fingerprint recognition sensor, a camera, a structured light sensor, a time-of-flight sensor, a distance sensor, a light sensor, etc., so that the sensor can collect signals through the display light-transmitting area, and thereby the display device realizes under-screen sensing solutions such as under-screen fingerprint recognition, under-screen camera, under-screen recognition, under-screen distance perception, and so on.

Further, the display device further includes a touch panel, and the touch panel is combined with the display panel in a built-in or plug-in manner, so that the display device has a touch function.

The display devices include a fixed terminal such as a TV and a desktop computer, and a mobile terminal such as a mobile phone and a notebook computer, and a wearable device such as bracelets, virtual reality (VR) device, and an augmented reality (AR) device.

Embodiments of the present application provides a display panel and a display device. The display panel 100 includes a display light-transmitting area 100a, a main display area 100c, and a transition area 100b between the display light-transmitting area 100a and the main display area 100c. The display panel 100 includes: a first light-emitting device 101 located in the display light-transmitting area 100a; a first pixel driving circuit 102 located in the transition display area 100b, and electrically connected to the first light-emitting device 101 for driving the first light-emitting device 101 to emit light; and a signal wiring layer 103 located on a side of the first pixel driving circuit 102 close to the first light-emitting device 101, and electrically connected to the first pixel driving circuit 102;

a first wiring layer 104 located on a side of the signal wiring layer 103 away from the first pixel driving circuit 102, extending along a direction from the transition display area 100 to the display light-transmitting area 100a, and connected between the first pixel driving circuit 102 and the first light-emitting device 101, wherein the first wiring layer 104 partially overlaps the signal wiring layer 103; and a capacitive barrier layer 105 located between the first wiring layer 104 and the signal wiring layer 103, wherein the capacitive barrier layer 105 includes at least one organic insulating layer 1051 to improve the uneven display caused by the parasitic capacitance Cp in the display light-transmitting area 100a, thereby improving the display effect of the display light-transmitting area 100a.

In the above embodiments, the descriptions of each embodiment have their own emphasis. The parts that are not described in detail in an embodiment can be referred to the detailed descriptions in other embodiments above, which will not be repeated herein for brevity.

The display panel and display device provided by the embodiments of the present application are described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising a main display area, and at least one display area surrounded by the main display area, wherein the display panel comprises:
   first light-emitting devices disposed in the at least one display area;
   first pixel driving circuits disposed in the at least one display area, and electrically connected to the first light-emitting devices respectively for driving the first light-emitting devices to emit light;
   a signal wiring layer electrically connected to the first pixel driving circuits;
   a first wiring layer disposed in the at least one display area, and connected between the first pixel driving circuits and the first light-emitting devices, wherein the first wiring layer partially overlaps the signal wiring layer; and
   a capacitive barrier layer disposed between the first wiring layer and the signal wiring layer, wherein the capacitive barrier layer comprises at least one organic insulating layer.

2. The display panel according to claim 1, wherein a relative dielectric constant of the organic insulating layer is less than or equal to 3.8.

3. The display panel according to claim 2, wherein the relative dielectric constant of the organic insulating layer is less than or equal to 3.3.

4. The display panel according to claim 1, wherein a thickness of the organic insulating layer is greater than or equal to 0.5 microns and less than or equal to 3 microns.

5. The display panel according to claim 4, wherein the thickness of the organic insulating layer is greater than or equal to 1.5 microns and less than or equal to 2.5 microns.

6. The display panel according to claim 1, wherein a visible light transmittance of the organic insulating layer is greater than or equal to 85%.

7. The display panel according to claim 1, wherein the organic insulating layer comprises a photosensitive resin composition.

8. The display panel according to claim 1, wherein the capacitive barrier layer further comprises an inorganic insulating layer on at least one side of the organic insulating layer.

9. The display panel according to claim 8, wherein the inorganic insulating layer is disposed between the organic insulating layer and the signal wiring layer, and/or the inorganic insulating layer is disposed between the organic insulating layer and the first wiring layer.

10. The display panel according to claim 9, wherein the inorganic insulating layer and the organic insulating layer are stacked periodically.

11. The display panel according to claim 1, wherein the organic insulating layer comprises a first organic insulating layer and a second organic insulating layer, which are made of different materials.

12. The display panel according to claim 11, wherein the first organic insulating layer and the second organic insulating layer have different dielectric constants and light transmittances.

13. The display panel according to claim 1, wherein the signal wiring layer comprises a power signal line connected to a first voltage terminal.

14. The display panel according to claim 1, wherein the display panel further comprises:
third light-emitting devices disposed in the main display area, and
second pixel driving circuits disposed in the main display area and electrically connected with the third light-emitting devices respectively,
wherein the first light-emitting devices and the third light-emitting devices have same number and arrangement.

15. The display panel according to claim 1, wherein the wiring layer comprises different layers of connecting wirings, an insulating layer is provided between every adjacent two layers of the different layers of connecting wirings, and the adjacent two layers of connecting wirings are electrically connected through respective via holes in the insulating layer.

16. A display device, comprising a main display area, and at least one display area surrounded by the main display area, wherein the display panel comprises:
first light-emitting devices disposed in the at least one display area;
first pixel driving circuits disposed in the at least one display area, and electrically connected to the first light-emitting devices respectively for driving the first light-emitting devices to emit light;
a signal wiring layer electrically connected to the first pixel driving circuits;
a first wiring layer disposed in the at least one display area, and connected between the first pixel driving circuits and the first light-emitting devices, wherein the first wiring layer partially overlaps the signal wiring layer; and
a capacitive barrier layer disposed between the first wiring layer and the signal wiring layer, wherein the capacitive barrier layer comprises at least one organic insulating layer.

17. The display device according to claim 16, wherein a relative dielectric constant of the organic insulating layer is less than or equal to 3.8.

18. The display device according to claim 16, wherein a thickness of the organic insulating layer is greater than or equal to 0.5 microns and less than or equal to 3 microns.

19. The display device according to claim 16, wherein a visible light transmittance of the organic insulating layer is greater than or equal to 85%.

20. The display device according to claim 16, further comprising a sensor facing the at least one display area.

* * * * *